(12) United States Patent
Lin

(10) Patent No.: US 10,903,179 B2
(45) Date of Patent: Jan. 26, 2021

(54) SEMICONDUCTOR CONTACT STRUCTURE HAVING STRESS BUFFER LAYER FORMED BETWEEN UNDER BUMP METAL LAYER AND COPPER PILLAR

(71) Applicant: UNITED MICROELECTRONICS CORPORATION, Hsinchu (TW)

(72) Inventor: Yu-Jie Lin, Taichung (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 16/294,906

(22) Filed: Mar. 6, 2019

(65) Prior Publication Data

US 2020/0251432 A1   Aug. 6, 2020

(30) Foreign Application Priority Data

Jan. 31, 2019   (CN) .......................... 2019 1 0096745

(51) Int. Cl.
  *H01L 23/00*   (2006.01)
(52) U.S. Cl.
  CPC .............. *H01L 24/05* (2013.01); *H01L 24/03* (2013.01); *H01L 24/11* (2013.01); *H01L 24/13* (2013.01);
  (Continued)
(58) Field of Classification Search
  CPC ......... H01L 24/03; H01L 24/05; H01L 24/08; H01L 24/11; H01L 24/13; H01L 24/16; H01L 24/81; H01L 2224/03462; H01L 2224/03912; H01L 2224/03916; H01L 2224/0401; H01L 2224/05018; H01L 2224/05019; H01L 2224/05083; H01L 224/05084; H01L 2224/05109; H01L 2224/05111; H01L 2224/05139; H01L 2224/05147; H01L 2224/05155; H01L 2224/05166; H01L 2224/05181; H01L 2224/05184; H01L 2224/08057; H01L 2224/11462; H01L 2224/13109;
  (Continued)

(56) References Cited

U.S. PATENT DOCUMENTS 8,736,050 B2 * 5/2014 Huang ................... H01L 24/11
                                                    257/621
9,006,097 B2 * 4/2015 Lu ........................... H01L 24/11
                                                    438/613

(Continued)

*Primary Examiner* — Stephen W Smoot

(57) ABSTRACT

Semiconductor apparatus and method for manufacturing semiconductor apparatus are provided. Semiconductor apparatus includes a semiconductor substrate having metal pads, a first passivation layer, a second passivation layer, an under bump metal layer, a stress buffer layer, a copper pillar and a solder structure. First passivation layer is formed on the semiconductor substrate and covers a portion of each metal pad, the first passivation layer has first passivation layer openings to expose a first portion of each metal pad. Second passivation layer is formed on the first passivation layer, the second passivation layer has second passivation layer openings to expose a second portion of each metal pad. Under bump metal layer is formed on the second portion of each metal pad exposed by the second passivation layer opening. Stress buffer layer is formed on the under bump metal layer, and the copper pillar is disposed on the stress buffer layer.

18 Claims, 17 Drawing Sheets

(52) U.S. Cl.
CPC ............ *H01L 2224/02181* (2013.01); *H01L 2224/03462* (2013.01); *H01L 2224/03912* (2013.01); *H01L 2224/0401* (2013.01); *H01L 2224/05018* (2013.01); *H01L 2224/05019* (2013.01); *H01L 2224/05083* (2013.01); *H01L 2224/05084* (2013.01); *H01L 2224/05109* (2013.01); *H01L 2224/05111* (2013.01); *H01L 2224/05139* (2013.01); *H01L 2224/05147* (2013.01); *H01L 2224/05155* (2013.01); *H01L 2224/05166* (2013.01); *H01L 2224/05181* (2013.01); *H01L 2224/05184* (2013.01); *H01L 2224/11462* (2013.01); *H01L 2224/11825* (2013.01); *H01L 2224/13006* (2013.01); *H01L 2224/1357* (2013.01); *H01L 2224/13147* (2013.01); *H01L 2924/35121* (2013.01)

(58) Field of Classification Search
CPC . H01L 2224/13111; H01L 2224/13139; H01L 2224/13147; H01L 2224/13155; H01L 2224/13166; H01L 2224/13181; H01L 2224/13184; H01L 2224/16057; H01L 2224/8136
See application file for complete search history.

(56) References Cited

U.S. PATENT DOCUMENTS

| | | | |
|---|---|---|---|
| 2012/0007230 A1* | 1/2012 | Hwang | H01L 24/13 257/737 |
| 2013/0009286 A1* | 1/2013 | Kim | H01L 24/03 257/632 |
| 2013/0026622 A1 | 1/2013 | Chuang et al. | |
| 2013/0127047 A1* | 5/2013 | Shen | H01L 24/03 257/737 |
| 2014/0117533 A1* | 5/2014 | Lei | H01L 24/05 257/737 |
| 2015/0123266 A1* | 5/2015 | Wu | H01L 23/49838 257/737 |
| 2015/0262952 A1* | 9/2015 | Lee | H01L 24/03 257/737 |
| 2018/0337143 A1* | 11/2018 | Lu | H01L 24/14 |

* cited by examiner

SEMICONDUCTOR CONTACT STRUCTURE HAVING STRESS BUFFER LAYER FORMED BETWEEN UNDER BUMP METAL LAYER AND COPPER PILLAR

FIELD OF THE INVENTION

The present invention relates to a semiconductor technology, and more particularly to a semiconductor apparatus having copper pillar structures and a method for manufacturing the semiconductor apparatus.

BACKGROUND OF THE INVENTION

The integrated circuit is made up of millions of active devices which are initially isolated from each other and then connected by interconnects to form functional circuits. In the flip-chip packaging technology, in order to obtain fine pitches, copper-pillar bump structures are often used as connection structures for connecting the interconnect structures to the package surface or other dies, wherein a metal pad is disposed on the contact of each interconnect structure. The conventional copper-pillar bump structure mainly includes an under bump metal (UBM) layer, a copper pillar and a solder cap on the copper pillar.

Generally, copper has good electrical conductivity, thermal conductivity and excellent electromigration resistance, but copper has higher Young's modulus and higher thermal expansion coefficient, so that there is more thermal-mechanical stress when applying the copper pillar to the flip-chip packaging. The copper pillar is usually disposed on the under bump metal layer, but the current conventional under bump metal layer is not enough to significantly reduce the thermo-mechanical stress. Therefore, in the semiconductor package component having the copper pillar, the adhesion between the copper-plated wiring and the polymer dielectric layer is not good, so as to cause the defect that the polymer dielectric layer and the wiring are easily delaminated. Not only the delamination defect causes the product to fail in the long-term reliability test, but also the crack between the wire and the polymer dielectric layer is occur in the reliability thermal cycling test (TCT) process because of the difference in thermal expansion coefficient between materials, so as to affect the function and lifetime of the product.

SUMMARY OF THE INVENTION

The present invention provides a semiconductor apparatus and a method for manufacturing the same, which solve the problem of delamination defects and cracks which are easily generated in the semiconductor apparatus.

The present invention provides a semiconductor apparatus including a semiconductor substrate, a first passivation layer, a second passivation layer, an under bump metal layer, a stress buffer layer, a copper pillar and a solder structure. The semiconductor substrate has at least one metal pad. The first passivation layer is formed on the semiconductor substrate and covers a portion of the at least one metal pad, wherein the first passivation layer has at least one first passivation layer opening to expose a first portion of the at least one metal pad. The second passivation layer is formed on the first passivation layer, wherein the second passivation layer has at least one second passivation layer opening to expose a second portion of the at least one metal pad. The under bump metal layer is at least formed on the second portion of the at least one metal pad exposed by the second passivation layer opening. The stress buffer layer is formed on the under bump metal layer, and the copper pillar is disposed on the stress buffer layer.

In one embodiment of the present invention, the material of the stress buffer layer is selected from one of tin, tin-silver, tin alloy, indium and indium alloy, and the material of the under bump metal layer is selected from one of titanium, titanium-tungsten and copper.

In one embodiment of the present invention, the semiconductor apparatus further includes a solder structure disposed on the copper pillar.

In one embodiment of the present invention, the semiconductor apparatus further includes a barrier layer disposed between the copper pillar and the stress buffer layer. In one embodiment, the material of the barrier layer is nickel, titanium or tantalum.

In one embodiment of the present invention, the surface of the stress buffer layer is not higher than the surface of the second passivation layer.

In one embodiment of the present invention, a cross-sectional area of the copper pillar is greater than or equal to a cross-sectional area of the stress buffer layer.

In one embodiment of the present invention, an area of the first passivation layer opening is greater than an area of the second passivation layer opening, and a cross-sectional area of the copper pillar is greater than the area of the first passivation layer opening and the area of the second passivation layer opening.

In one embodiment of the present invention, an area of the first passivation layer opening is smaller than an area of the second passivation layer opening, and the under bump metal layer directly contacts a portion of the first passivation layer and a portion of the second passivation layer.

In one embodiment of the present invention, the under bump metal layer is further formed on an inner wall of the second passivation layer opening, and a portion of the second passivation layer at a periphery of the second passivation layer opening.

In one embodiment of the present invention, the copper pillar further covers the portion of the second passivation layer at the periphery of the second passivation layer opening.

The present invention provides a method for manufacturing a semiconductor apparatus. The method includes: providing a semiconductor substrate having at least one metal pad; forming a first passivation layer on the semiconductor substrate and covering a portion of the at least one metal pad, the first passivation layer having at least one first passivation layer opening to expose a first portion of the at least one metal pad; forming a second passivation layer on the first passivation layer, the second passivation layer having at least one second passivation layer opening to expose a second portion of the at least one metal pad; forming an under bump metal layer on the exposed second portion of the at least one metal pad, an inner wall of the second passivation layer opening, and a portion of the second passivation layer; forming a stress buffer layer on a portion of the under bump metal layer on the at least one metal pad; forming a copper pillar on the stress buffer layer to cover the stress buffer layer and a portion of the under bump metal layer; forming a solder structure on the copper pillar.

In one embodiment of the present invention, a barrier layer is further formed on the stress buffer layer before forming the copper pillar, such that the barrier layer is located between the stress buffer layer and the copper pillar, and the material of the barrier layer is nickel, titanium or tantalum.

In one embodiment of the present invention, the formation of the stress buffer layer, the copper pillar and the solder structure includes the following steps: forming a first photoresist layer on the under bump metal layer and forming at least one first opening in the first photoresist layer to expose a portion of the under bump metal layer via the first opening; electroplating the stress buffer layer on the portion of the under bump metal layer exposed by the first opening; electroplating the copper pillar on the stress buffer layer exposed by the first opening; electroplating the solder structure on the copper pillar; and removing the first photoresist layer.

In one embodiment of the present invention, the copper pillar further covers a portion of the under bump metal layer around the stress buffer layer.

In one embodiment of the present invention, a portion of the under bump metal layer that is not covered by the copper pillar is removed while or after the first photoresist layer is removed.

In one embodiment of the present invention, the formation of the stress buffer layer, the copper pillar and the solder structure includes the following steps: forming a first photoresist layer on the under bump metal layer and forming at least one first opening in the first photoresist layer to expose a portion of the under bump metal layer via the first opening; electroplating the stress buffer layer on the portion of the under bump metal layer exposed by the first opening; removing the first photoresist layer; forming a second photoresist layer on the under bump metal layer and forming at least one second opening in the second photoresist layer, the second opening being larger than the first opening, to expose the stress buffer layer and a portion of the under bump metal layer via the second opening; electroplating the copper pillar on the stress buffer layer and the portion of the under bump metal layer exposed by the second opening; electroplating the solder structure on the copper pillar; and removing the second photoresist layer.

In one embodiment of the present invention, a portion of the under bump metal layer that is not covered by the copper pillar is removed while or after the second photoresist layer is removed.

In the present invention, by arranging the stress buffer layer between the copper pillar and the under bump metal layer, the higher thermal-mechanical stress on the semiconductor apparatus, which is caused by higher Young's modules and high thermal expansion of the copper, can be effectively reduced to prevent from the IMD (inter-metal dielectric) delamination, and the problem of cracks caused by the difference in thermal expansion coefficient between materials can also be improved.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
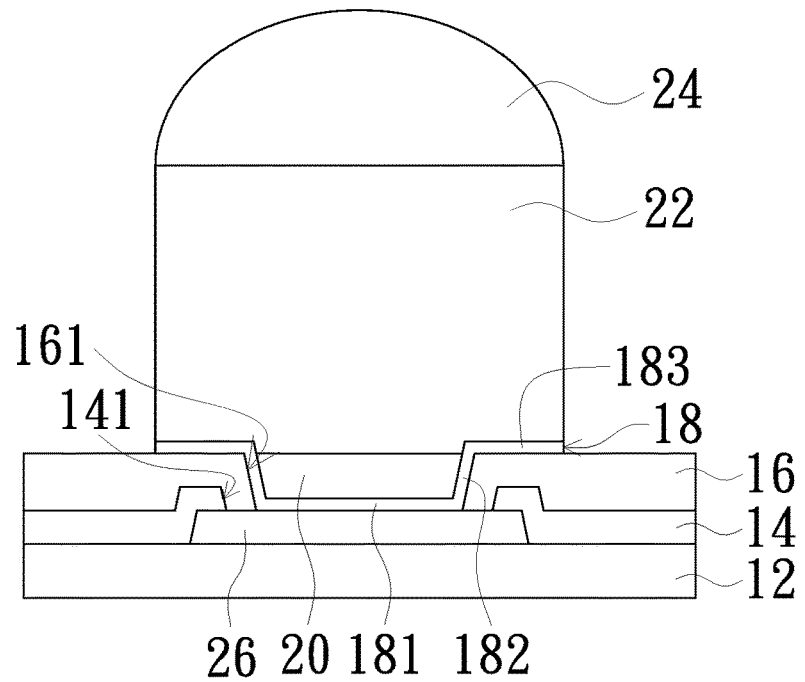
FIG. 1 is a schematic structural diagram of a semiconductor apparatus according to a first embodiment of the present invention.

FIG. 1 is a schematic structural diagram of a semiconductor apparatus according to a first embodiment of the present invention. As shown in FIG. 1, the semiconductor apparatus 10 includes a semiconductor substrate 12, a first passivation layer (PASV) 14, a second passivation layer (re-passivation layer, Re-PASV) 16, an under bump metal (UBM) layer 18, a stress buffer layer 20, a copper pillar 22 and a solder structure 24.

The semiconductor substrate 12 has at least one metal pad 26 thereon. The semiconductor substrate 12 may be a silicon wafer or a layer of silicon-containing material, and integrated circuits may be formed therein or thereon. The layered structures and characteristic structures of the semiconductor substrate 12, such as transistors, interconnect layer structures, protected interconnect structures, redistribution layers, and the like, are omitted and are not shown in the diagram. In one embodiment, the metal pads 26 are, for example, on the active surface of the chip or wafer, and the metal pads 26 are, for example, aluminum pads. In another embodiment, depending on the different locations of the contacts on the semiconductor substrate 12, a redistribution layer (not shown) may be provided, the metal pad 26 are, for example, located on the redistribution layer, and the metal pads 26 are, for example, copper pads. The subsequent figures and embodiments are exemplified by a semiconductor substrate having one metal pad, but it will be understood that the semiconductor substrate may have a plurality of metal pads thereon.

The first passivation layer 14 is formed on the semiconductor substrate 12 and a portion of the metal pad 26 is covered by the first passivation layer 14, wherein the first passivation layer 14 is defined with at least one first passivation layer opening 141, and a first portion of the metal pad 26 is exposed by the first passivation layer opening 141. For example, the semiconductor substrate 12 and the outer edge of the metal pad 26 is covered by the first passivation layer 14 and an intermediate portion (first portion) of the metal pad 26 is exposed by the first passivation layer opening 141. In one embodiment, the first passivation layer 14 is composed of, for example, non-organic materials such as undoped silicon glass (USG), silicon nitride, silicon oxynitride, silicon oxide, or the like. Or alternatively, the first passivation layer 14 is composed of, for example, polymer such as epoxide, benzocyclobutene (BCB) or polybenzoxazole (PBO).

The second passivation layer 16 is formed on the first passivation layer 14 and a portion of the metal pad 26 is covered by the second passivation layer 16, wherein the second passivation layer 16 is defined with at least one second passivation layer opening 161, and the second passivation layer opening 161 may be smaller than, equal to or larger than the first passivation layer opening 141. In the first embodiment shown in FIG. 1, the second passivation layer opening 161 is smaller than the first passivation layer opening 141, and the outer edge of the exposed first portion of the metal pad 26 is covered by the second passivation layer 16, so that the area of the first portion of the metal pad 26 is reduced to be as the second portion of the metal pad 26, which is exposed by the second passivation layer opening 161. In one embodiment, the second passivation layer 16 is composed of, for example, polyimide or other soft polymer.

The under bump metal layer 18 is formed on the exposed second portion of the metal pad 26, an inner wall of the second passivation layer opening 161, and a portion of the second passivation layer 16 at the periphery of the second passivation layer opening 161. In one embodiment, the under bump metal layer 18 is slightly concave, having a bottom portion 181, a side portion 182 and an upper edge portion 183, wherein the bottom portion 181 is arranged on the exposed second portion of the metal pad 26, the side portion 182 is arranged on the inner wall of the second passivation layer opening 161, and the upper edge portion 183 is arranged on the portion of the second passivation layer 16 at the periphery of the second passivation layer opening 161. In one embodiment, the under bump metal layer 18 is composed of, for example, titanium, titanium tungsten, copper, or the like.

The stress buffer layer 20 is formed on the under bump metal layer 18. Specifically, the stress buffer layer 20 is formed on the bottom portion 181 and the side portion 182 of the under bump metal layer 18. In one embodiment, the height of the stress buffer layer 20 is between 5 micrometers and 7.5 micrometers, and the height of the stress buffer layer 20 is not higher than the top surface of the second passivation layer 16. Further, the material of the stress buffer layer 20 is selected from one of tin, tin silver, tin alloy, indium, and indium alloy.

The copper pillar 22 is disposed on the stress buffer layer 20, and the copper pillar 22 is, for example, cylindrical in shape, and the cross-sectional area of the copper pillar 22 may be greater than or equal to the cross-sectional area of the stress buffer layer 20. In the first embodiment as shown in FIG. 1, the cross-sectional area of the copper pillar 22 is larger than the maximum cross-sectional area of the stress buffer layer 20, and the copper pillar 22 further covers the upper edge portion 183 of the under bump metal layer 18 in addition to the stress buffer layer 20. Further, the height of the copper pillar 22 is between 20 micrometers and 30 micrometers.

The solder structure 24 is disposed on the copper pillar 22. In one embodiment, the solder structure 24 may be spherical, hemispherical, bumps or the like, and the material of the solder structure 24 is selected from one of tin, tin silver, and tin alloy.

Figure 2:
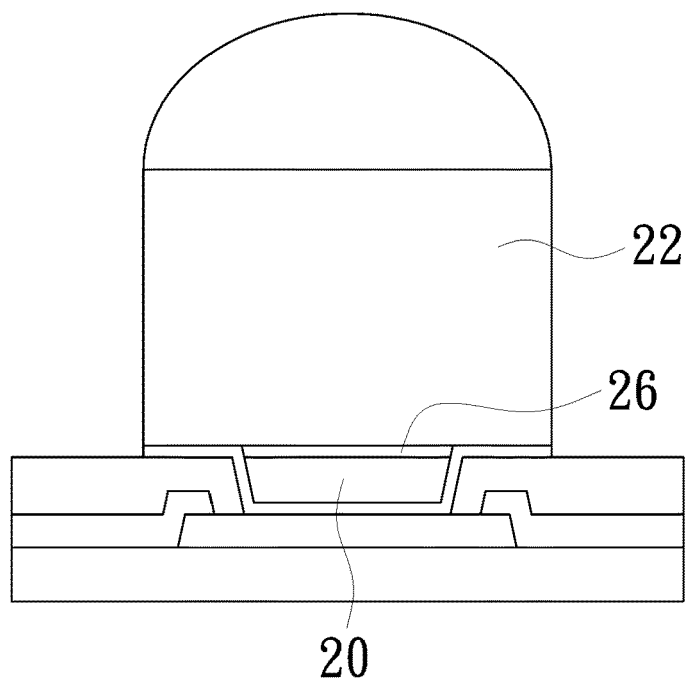
FIG. 2 is a schematic structural diagram of a semiconductor apparatus according to a second embodiment of the present invention.

FIG. 2 is a schematic structural diagram of a semiconductor apparatus according to a second embodiment of the present invention. As shown in FIG. 2, the difference between the semiconductor apparatus 10A of the second embodiment and the semiconductor apparatus 10 of the first embodiment is that the semiconductor apparatus 10A further includes a barrier layer 26 arranged between the copper pillar 22 and the stress buffer layer 20, and the material of the barrier layer 26 is, for example, nickel, titanium or tantalum. By the arrangement of the barrier layer 26, the loss of the stress buffer layer 20 during the reflow process and device operation can be reduced to increase the lifetime/lifespan of the semiconductor apparatus 10A.

Figure 3:
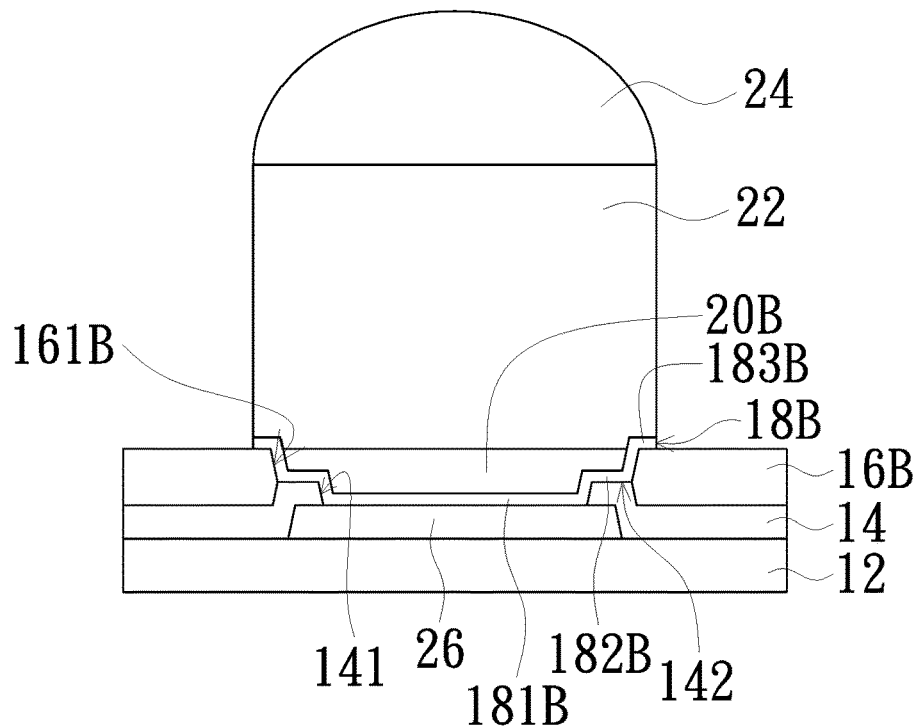
FIG. 3 is a schematic structural diagram of a semiconductor apparatus according to a third embodiment of the present invention.

FIG. 3 is a schematic structural diagram of a semiconductor apparatus according to a third embodiment of the present invention. As shown in FIG. 3, the semiconductor apparatus 10B of the third embodiment includes a semiconductor substrate 12, a first passivation layer 14, a second passivation layer 16B, an under bump metal layer 18B, a stress buffer layer 20B, a copper pillar 22, and a solder structure 24. The semiconductor apparatus 10B differs from the semiconductor apparatus 10 in the structures of the second passivation layer 16B, the under bump metal layer 18B, and the stress buffer layer 20B, respectively. As shown in FIG. 3, in the semiconductor apparatus 10B, the second passivation layer 16B is formed on the first passivation layer 14, wherein the second passivation layer 16B defines at least one second passivation layer opening 161B, and the second passivation layer opening 161B is larger than the first passivation layer opening 141. That is, the first portion of the metal pad 26 and a portion of a surface 142 of the first passivation layer 14 at the periphery of the first passivation layer opening 141 are exposed by the second passivation layer opening 161B.

Continue with the above description, as shown in FIG. 3, the under bump metal layer 18B is formed on the first portion of the metal pad 26 exposed by the first passivation layer opening 141, the inner wall of the first passivation layer opening 141, the portion of the surface 142 of the first passivation layer 14 exposed by the second passivation layer opening 161B, the inner wall of the second passivation layer opening 161B, and a portion of the second passivation layer 16B at the periphery of the second passivation layer opening 161B. In one embodiment, the under bump metal layer 18B is slightly concave, having a bottom portion 181B, a stepped side portion 182B, and an upper edge portion 183B, wherein the bottom portion 181B is arranged on the exposed first portion of the metal pad 26, the stepped side portion 182B is arranged on the inner wall of the first passivation layer opening 141, the portion of the surface 142 of the first passivation layer 14 exposed by the second passivation layer opening 161B and the inner wall of the second passivation layer opening 161B, and the upper edge portion 183B is arranged on the portion of the second passivation layer 16B at the periphery of the second passivation layer opening 161B. In other words, the stepped side portion 182B of the under bump metal layer 18B of the semiconductor apparatus 10B may directly contact both the first passivation layer 14 and the second passivation layer 16B, rather than the under bump metal layer 18 of the semiconductor apparatus 10 only contacts the second passivation layer 16, as shown in first embodiment.

Continue with the above description, as shown in FIG. 3, the stress buffer layer 20B is formed on the under bump metal layer 18B. Specifically, the stress buffer layer 20B is formed on the bottom portion 181B and the stepped side portion 182B of the under bump metal layer 18B. Further, similarly to the semiconductor apparatus 10 of the first embodiment, the copper pillar 22 and the solder structure 24 are sequentially formed on the stress buffer layer 20B, and will not be described again.

Figure 4:
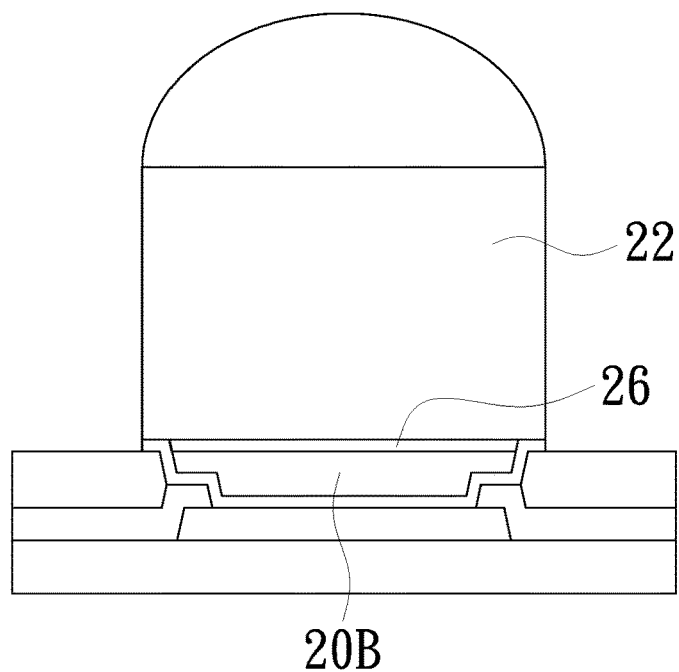
FIG. 4 is a schematic structural diagram of a semiconductor apparatus according to a fourth embodiment of the present invention.

FIG. 4 is a schematic structural diagram of a semiconductor apparatus according to a fourth embodiment of the present invention. As shown in FIG. 4, the difference between the semiconductor apparatus 10C of the fourth embodiment and the semiconductor apparatus 10B of the third embodiment is that the semiconductor apparatus 10C further includes a barrier layer 26 arranged between the copper pillar 22 and the stress buffer layer 20B, and the material of the barrier layer 26 is, for example, nickel, titanium or tantalum. By the arrangement of the barrier layer 26, the loss of the stress buffer layer 20B during the reflow process and device operation can be reduced to increase the lifetime/lifespan of the semiconductor apparatus 10C.

Figure 5:
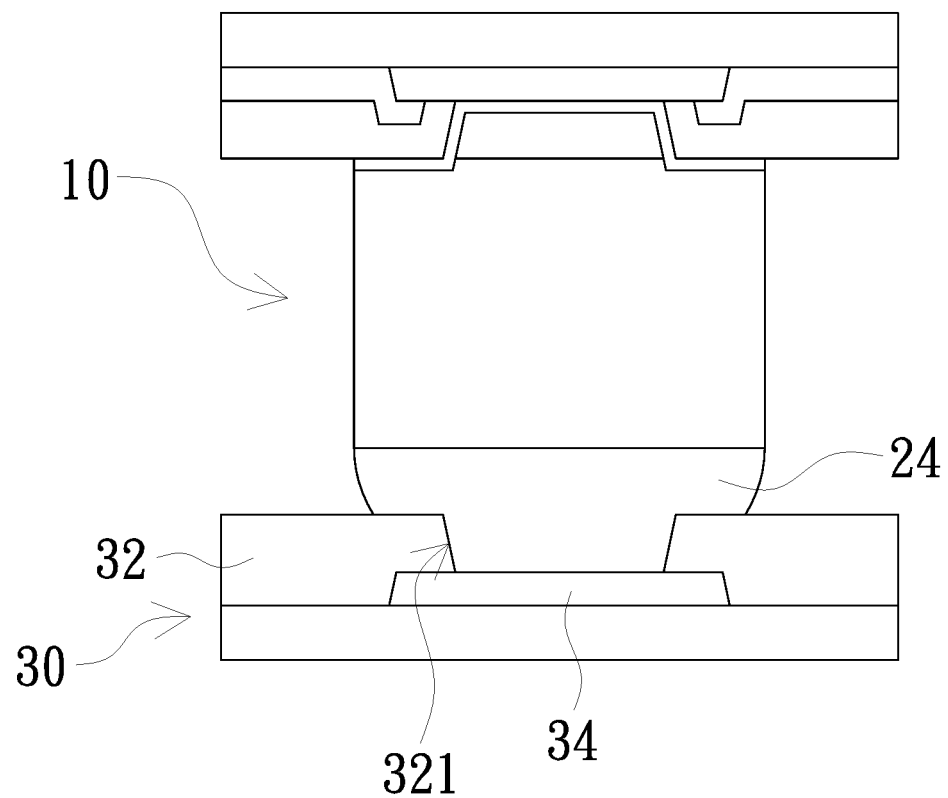
FIG. 5 is a schematic diagram showing an electrical connection between one semiconductor apparatus and another electrical component according to an embodiment of the present invention.

FIG. 5 is a schematic diagram showing the electrical connection between one semiconductor apparatus and another electrical component according to an embodiment of the present invention. As shown in FIG. 5, the semiconductor apparatus 10 shown in the first embodiment is taken as an example. The solder structure 24 of the semiconductor apparatus 10 may contact an another electrical component 30 and then the semiconductor apparatus 10 and the another electrical component 30 are bonded by the reflow process. In one embodiment, the another electrical component 30 may be a substrate such as a printed circuit board, wafer or chip and the substrate has a protective layer 32 thereon, wherein the protective layer 32 has openings 321 to expose the pads 34 on the printed circuit board, wafer or chip, so that the solder structure 24 of the semiconductor apparatus 10 may be bonded with the exposed pad 34. In one embodiment, if the electrical component 30 is a printed circuit board, the protective layer 32 is a solder mask on the printed circuit board. In one embodiment, if the electrical component 30 is a wafer or chip, the protective layer 32 is a polymeric protective layer (PASV or Re-PASV).

Figure 5A:
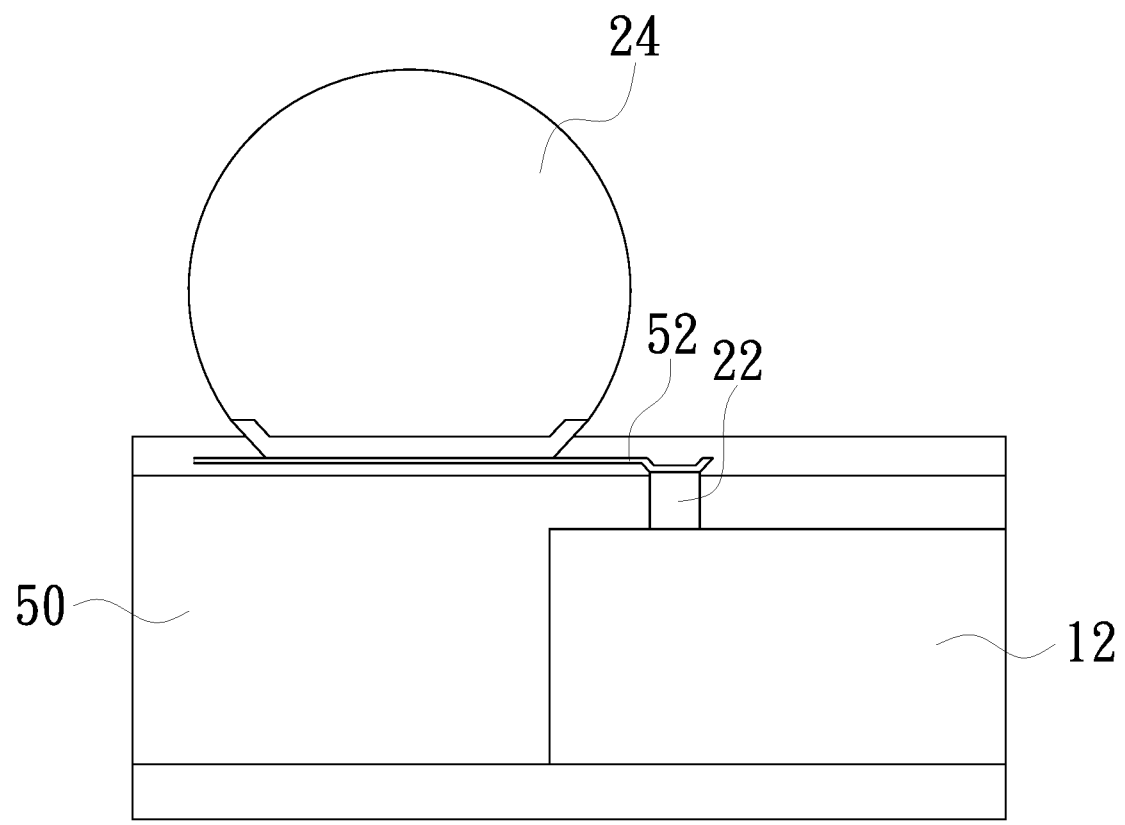
FIG. 5A is a partial structural diagram of a semiconductor apparatus applied to a fan-out package according to an embodiment of the present invention.

FIG. 5A is a partial structural diagram of a semiconductor apparatus applied to a fan-out package according to an embodiment of the present invention. As shown in FIG. 5A, in this embodiment, a molding compound 50 is used to cover the copper pillar 22 and the semiconductor substrate 12, such as a chip, wherein one end of the copper pillar 22 is exposed to the molding compound 50, and the exposed end of the copper pillar 22 is fanned out by a redistribution layer 52 for arranging the solder structure 24, such as a solder ball. Although not shown, it should be understood that when the semiconductor apparatus of the embodiment of the present invention is applied to the fan-out package, the passivation layer, the under bump metal layer, the stress buffer layer, the barrier layer, and the like as shown in the foregoing embodiments may still be arranged between the semiconductor substrate 12 and the copper pillar 22, and details are not described herein.

Figure 6A:
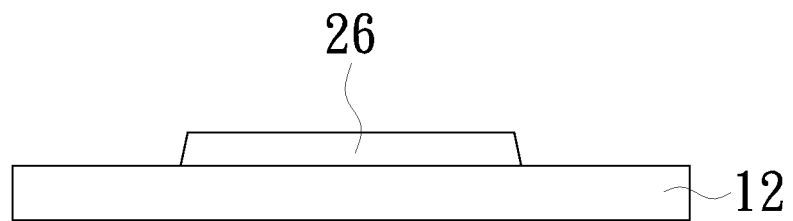
FIGS. 6A to 6L are schematic diagrams showing a process flow of a method for manufacturing a semiconductor apparatus according to an embodiment of the present invention.
Figure 6B:
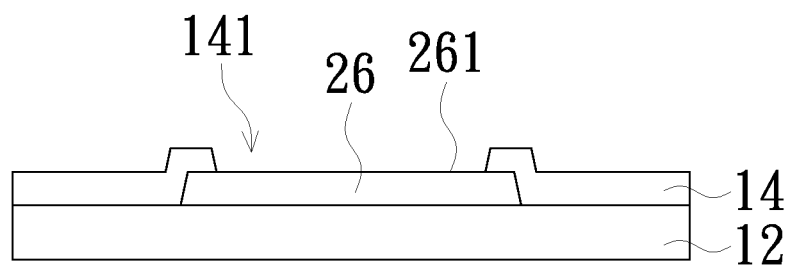
Figure 6C:
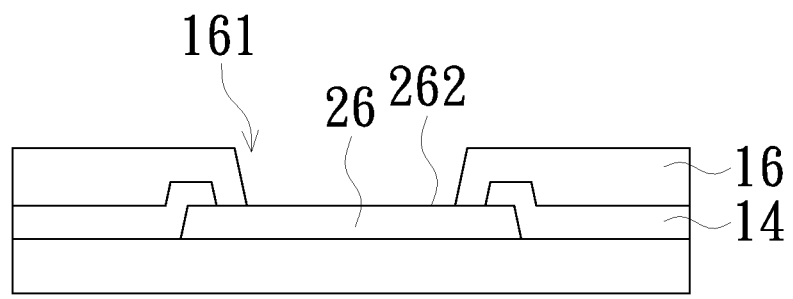
Figure 6D:
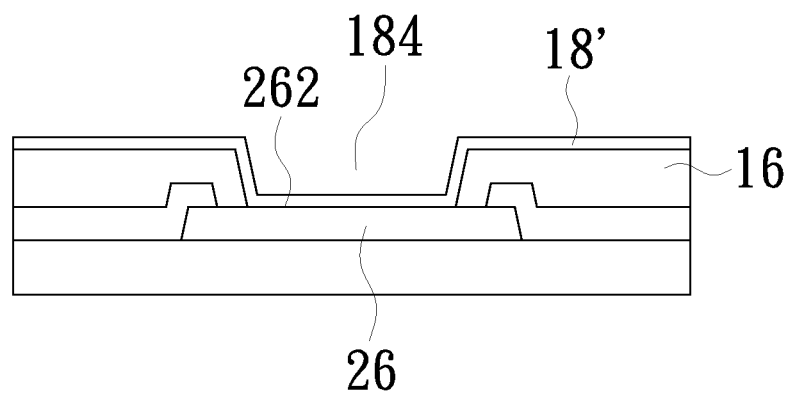

FIGS. 6A to 6L are schematic diagrams showing a process flow of a method for manufacturing a semiconductor apparatus according to an embodiment of the present invention. As shown in FIG. 6A, a semiconductor substrate 12 having at least one metal pad 26 thereon is provided. Next, as shown in FIG. 6B, a first passivation layer 14 is formed on the semiconductor substrate 12 and covers a portion of the metal pad 26, wherein the first passivation layer 14 has at least one first passivation layer opening 141 to expose a first portion 261 of the metal pad 26. In one embodiment, the outer edge of the metal pad 26 is covered by the first passivation layer 14 and the intermediate portion (first portion 261) of the metal pad 26 is exposed by the first passivation layer opening 141. Next, as shown in FIG. 6C, a second passivation layer 16 is formed on the first passivation layer 14, wherein the second passivation layer 16 has a second passivation layer opening 161. In one embodiment, the second passivation layer opening 161 is smaller than the first passivation layer opening 141 (labeled in FIG. 6B), so that the second passivation layer 16 may cover the first passivation layer 14 and the outer edge of the first portion 261 of the metal pad 26, but a second portion 262 of the metal pad 26 is exposed by the second passivation layer opening 161. Thereafter, as shown in FIG. 6D, an under bump metal layer 18' is formed on the exposed second portion 262 of the metal pad 26, the inner wall of the second passivation layer opening 161 (labeled in FIG. 6C), and the second passivation layer 16. The under bump metal layer 18' is formed, for example, by sputtering, evaporation, or electroplating, and a portion of the under bump metal layer 18' is slightly concave to have an accommodating portion 184 at a position corresponding to the metal pad 26.

Figure 6E:
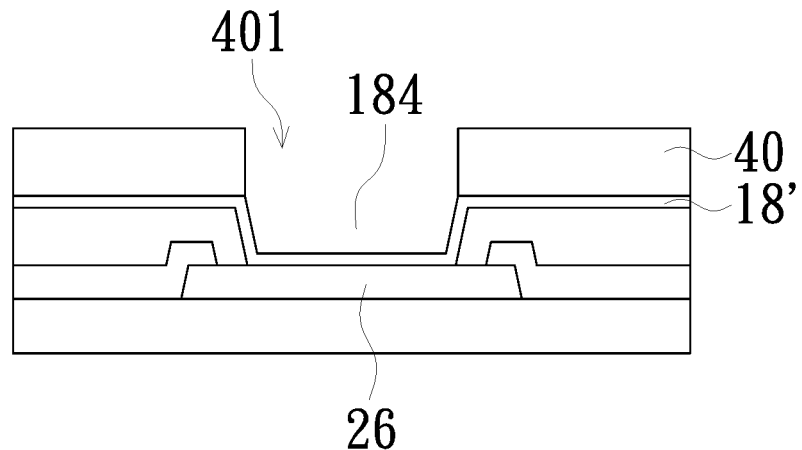
Figure 6F:
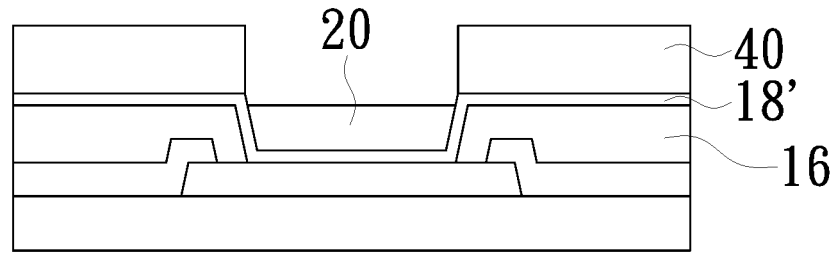
Figure 6G:
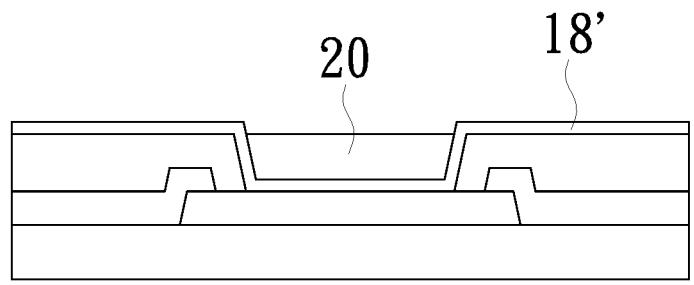

Continue with the above description, as shown in FIG. 6E, a first photoresist layer 40 is formed on the under bump metal layer 18', and a first opening 401 is formed in the first photoresist layer 40 by using exposure and development technique. In one embodiment, the position and the size of the first opening 401 correspond to the position and the size of the accommodating portion 184, and a portion of the under bump metal layer 18' is exposed by the first opening 401, for example, the portion of the under bump metal layer 18' that is in contact with the metal pad 26 is exposed. Next, as shown in FIG. 6F, a stress buffer layer 20 is electroplated on the accommodating portion 184 (labeled in FIG. 6E) of the under bump metal layer 18' by using the first photoresist layer 40 as a mask. The material of the stress buffer layer 20 is selected from one of tin, tin silver, tin alloy, indium, and indium alloy. In one embodiment, the height of the stress buffer layer 20 does not exceed the height of the accommodating portion 184. For example, the top surface of the stress buffer layer 20 is not higher than the top surface of the second passivation layer 16. In one embodiment, the height of the stress buffer layer 20 is between 5 micrometers and 7.5 micrometers. Thereafter, the first photoresist layer 40 is removed, as shown in FIG. 6G, to expose the stress buffer layer 20 and a portion of the under bump metal layer 18' not covered by the stress buffer layer 20.

Figure 6H:
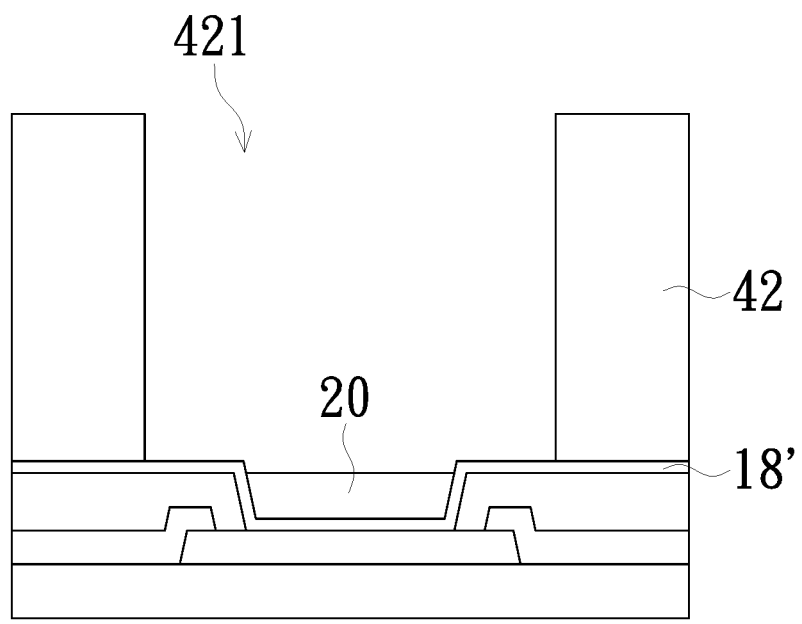
Figure 6I:
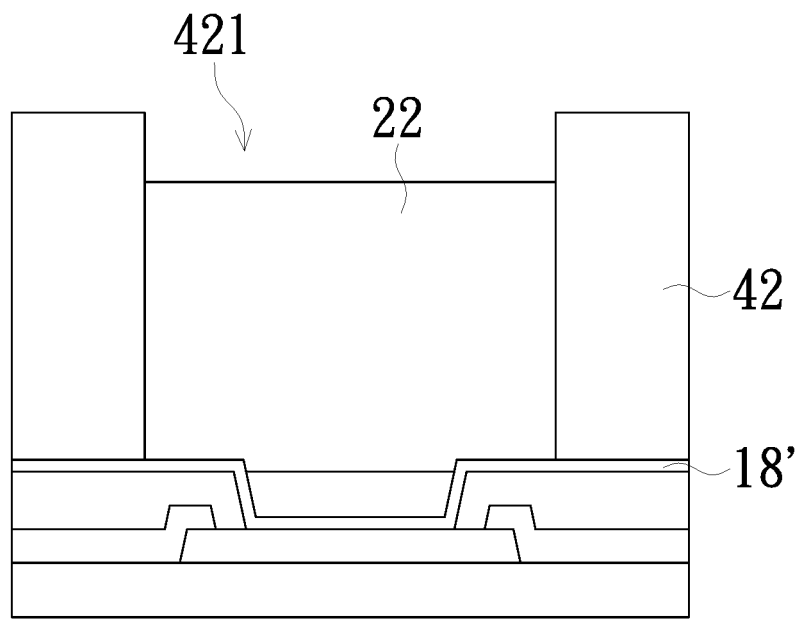

Continue with the above description, as shown in FIG. 6H, a second photoresist layer 42 is formed on the under bump metal layer 18', and a second opening 421 is formed in the second photoresist layer 42 by using exposure and development technique. In one embodiment, the second opening 421 is larger than the first opening 401 (labeled in FIG. 6E) of the first photoresist layer 40, and the stress buffer layer 20 and a portion of the under bump metal layer 18' are exposed by the second opening 421. Next, as shown in FIG. 6I, a copper plating treatment is performed by using the second photoresist layer 42 as a mask, to make the precipitate of copper in the plating solution to be plated to the stress buffer layer 20 and the portion of the exposed under bump metal layer 18' to form a bump structure such as the copper pillar 22, wherein the copper pillar 22 simultaneously covers the stress buffer layer 20 and a portion of the under bump metal layer 18' around the stress buffer layer 20. In one embodiment, the plated copper pillar 22 does not completely fill the second opening 421 of the second photoresist layer 42 and the height of the copper pillar 22 is between 20 micrometers and 30 micrometers.

Figure 6J:
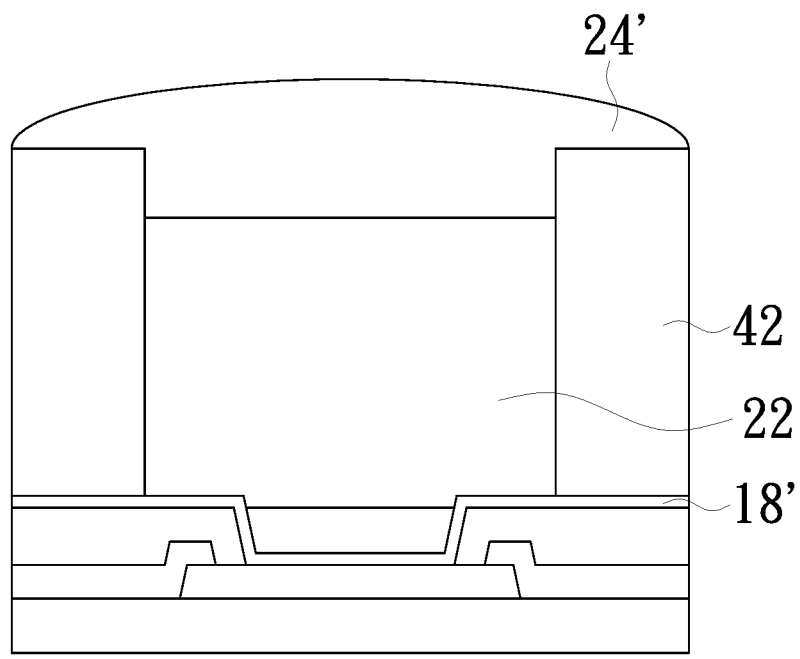

Then, as shown in FIG. 6J, a solder plating process is performed by using the same second photoresist layer 42 as a mask, to form a mushroom-like solder structure 24' on the surface of the copper pillar 22, wherein the solder structure 24' fills the second opening 421 (labeled in FIG. 6I) of the second photoresist layer 42 and protrudes over the second photoresist layer 42. The material of the solder structure 24' is, for example, tin, tin silver, tin alloy or the like having a low melting point.

Figure 6K:
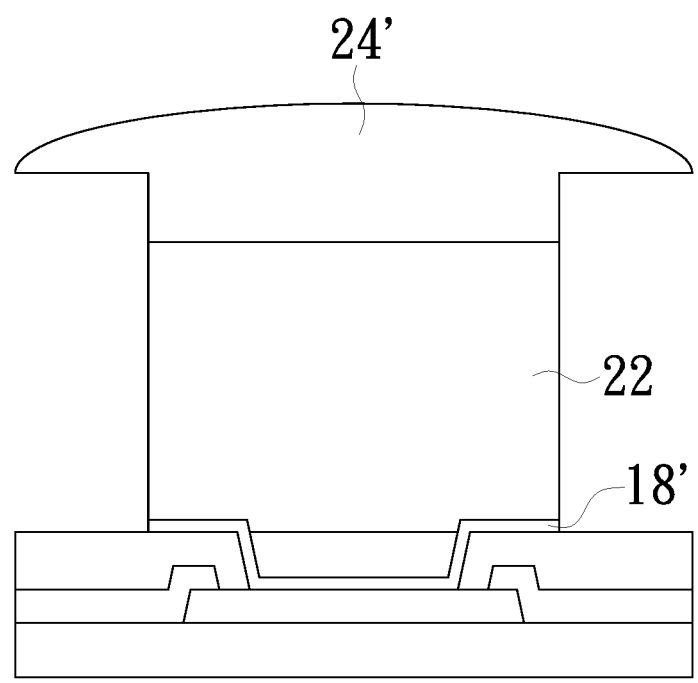
Figure 6L:
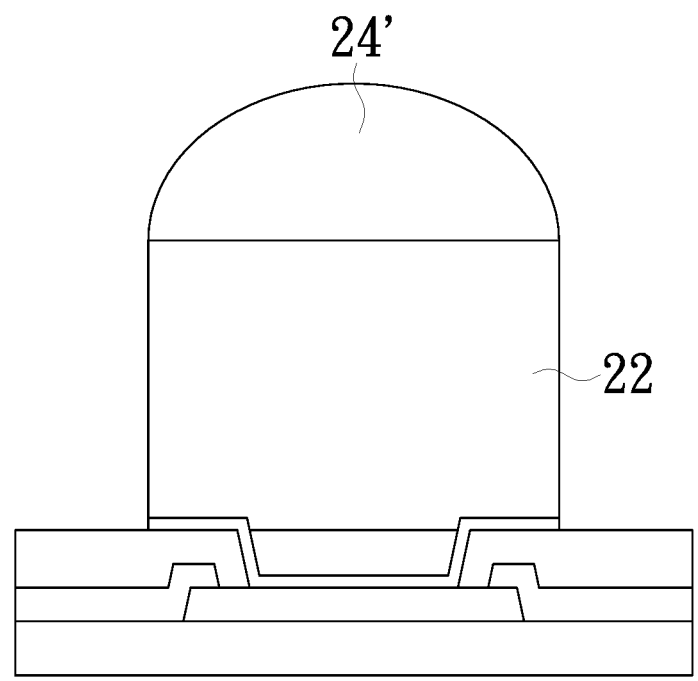

Thereafter, the second photoresist layer 42 is removed, and a portion of the under bump metal layer 18' not covered by the copper pillar 22 is etched while or after the second photoresist layer 42 is removed, as shown in FIG. 6K, the under bump metal layer 18' at the bottom of the copper pillar 22 is retained. Finally, the solder structure 24' is reflowed, as shown in FIG. 6L, and the solder structure 24' is melted into a spherical shape or a hemispherical shape.

Wherein, in another embodiment which is not shown, after the stress buffer layer 20 is formed, a barrier layer is electroplated on the stress buffer layer 20 by again using the first photoresist layer 40 as a mask. Then, the first photoresist layer 40 is removed, and the processes for manufacturing the copper pillar 22 and solder structure 24' described above are performed. As such, the barrier layer is arranged between the stress buffer layer 20 and the copper pillar 22. The material of the barrier layer is, for example, nickel, titanium or tantalum.

Figure 7A:
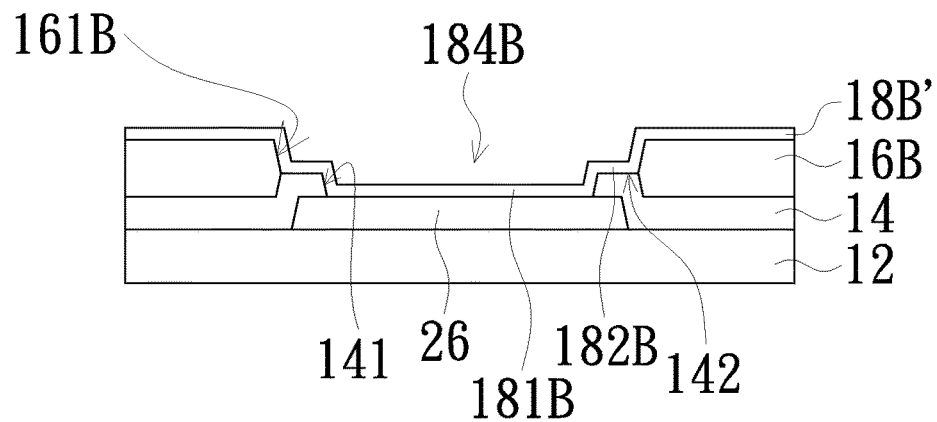
FIGS. 7A to 7I are schematic diagrams showing a process flow of a method for manufacturing a semiconductor apparatus according to another embodiment of the present invention.

FIGS. 7A to 7I are schematic diagrams showing a process flow of a method for manufacturing a semiconductor apparatus according to another embodiment of the present invention. FIG. 7A illustrates that a first passivation layer 14, a second passivation layer 16B, and an under bump metal layer 18B' have been formed on the semiconductor substrate 12 having at least one metal pad 26. Wherein, the first passivation layer 14 is formed on the semiconductor substrate 12, the outer edge of the metal pad 26 is covered by the first passivation layer 14 and the intermediate portion (first portion) of the metal pad 26 is exposed by the first passivation layer opening 141. The second passivation layer 16B having the second passivation layer opening 161B larger than the first passivation layer opening 141 is formed on the first passivation layer 14, and the first portion of the metal pad 26 and a portion of the surface 142 of the first passivation layer 14 at the periphery of the first passivation layer opening 141 are exposed by the second passivation layer opening 161B. The under bump metal layer 18B' is formed on the first portion of the metal pad 26 exposed by the first passivation layer opening 141, the inner wall of the first passivation layer opening 141, the portion of the surface 142 of the first passivation layer 14 exposed by the second passivation layer opening 161B, the inner wall of the second passivation layer opening 161B, and the portion of the second passivation layer 16B at the periphery of the second passivation layer opening 161B. A portion of the under bump metal layer 18B' is slightly concave to have an accommodating portion 184B at a position corresponding to the metal pad 26, wherein the accommodating portion 184B includes a bottom portion 181B and a stepped side portion 182B.

Figure 7B:
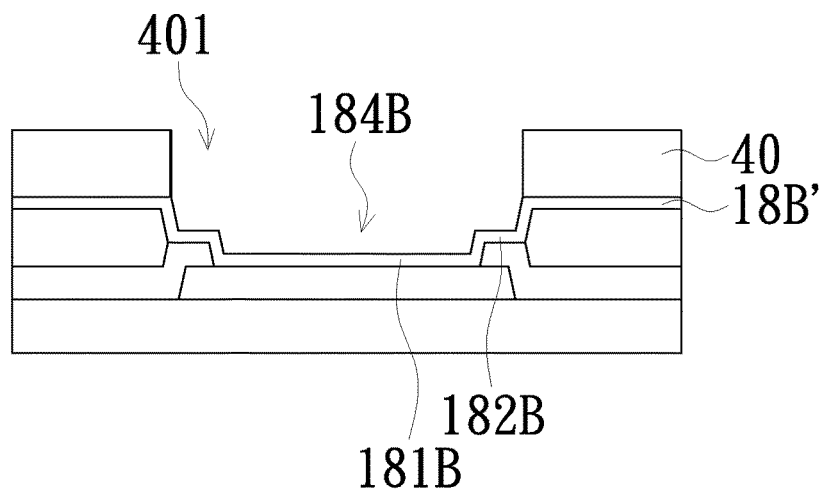
Figure 7C:
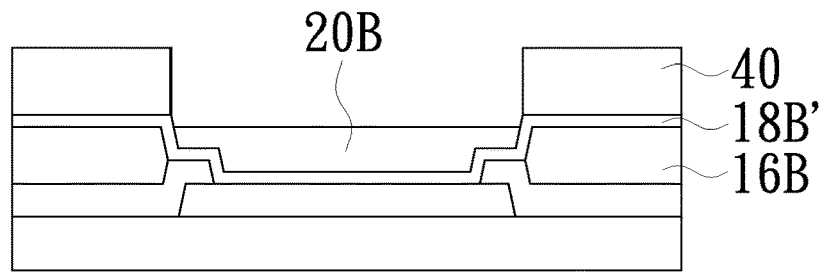
Figure 7D:
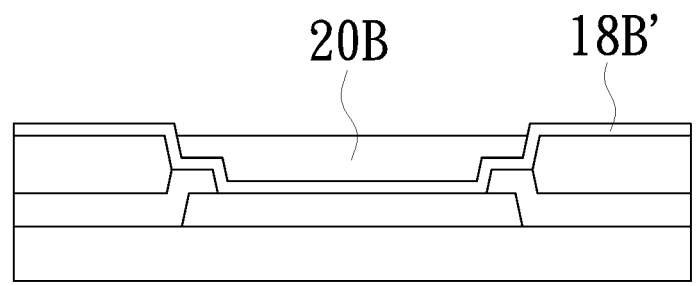

Next, as shown in FIG. 7B, a first photoresist layer 40 having a first opening 401 is formed on the under bump metal layer 18', and a portion of the under bump metal layer 18B', for example, the bottom portion 181B and the stepped side portion 182B of the accommodating portion 184B, is exposed by the first opening 401. Next, as shown in FIG. 7C, the stress buffer layer 20B is electroplated on the accommodating portion 184B (labeled in FIG. 7B) of the under bump metal layer 18B' by using the first photoresist layer 40 as a mask. The material of the stress buffer layer 20B is selected from one of tin, tin silver, tin alloy, indium, and indium alloy. In one embodiment, the top surface of the stress buffer layer 20B is not higher than the top surface of the second passivation layer 16B. Thereafter, as shown in FIG. 7D, the first photoresist layer 40 is removed to expose the stress buffer layer 20B and a portion of the under bump metal layer 18B' which is not covered by the stress buffer layer 20B.

Figure 7E:
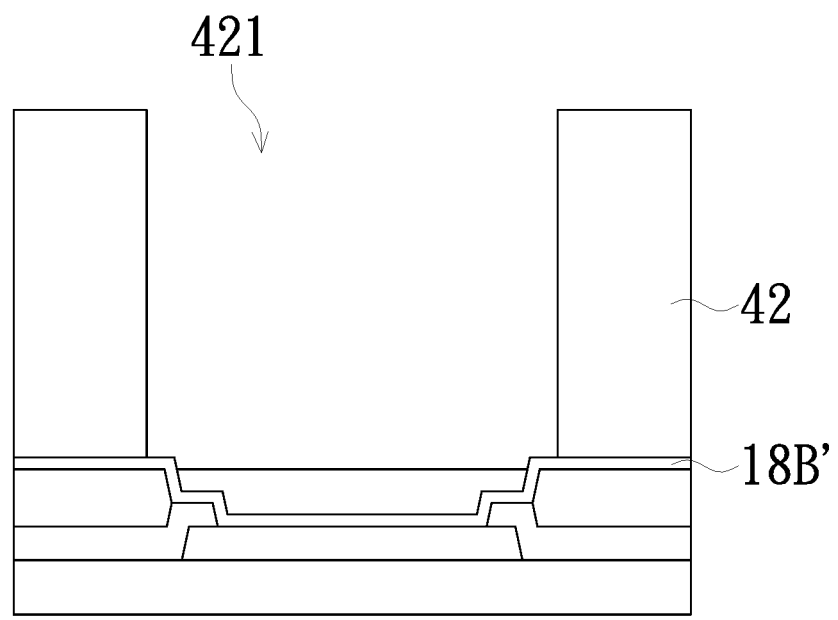
Figure 7F:
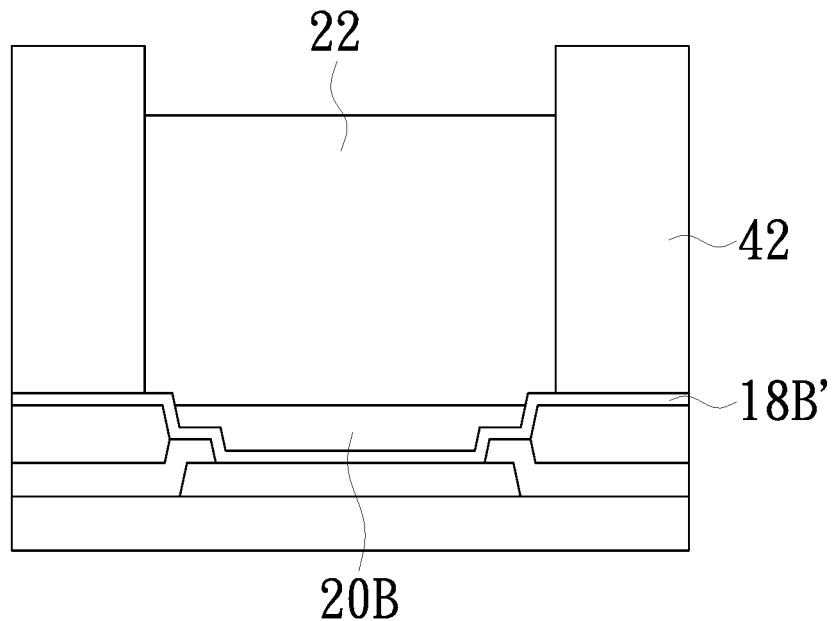
Figure 7G:
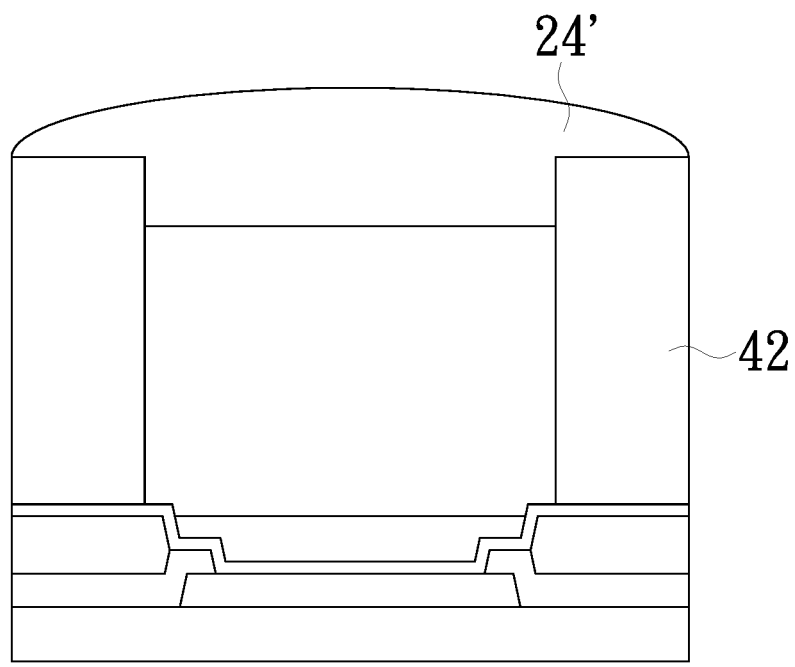
Figure 7H:
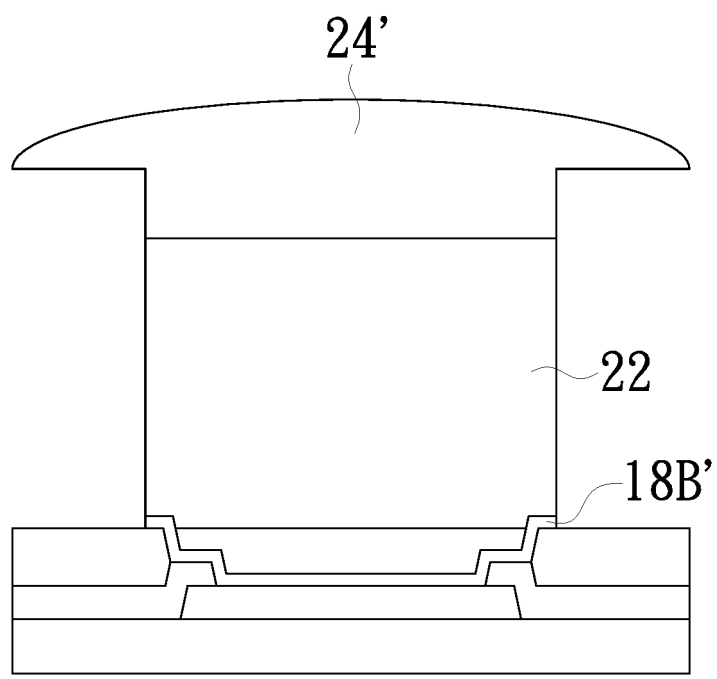
Figure 7I:
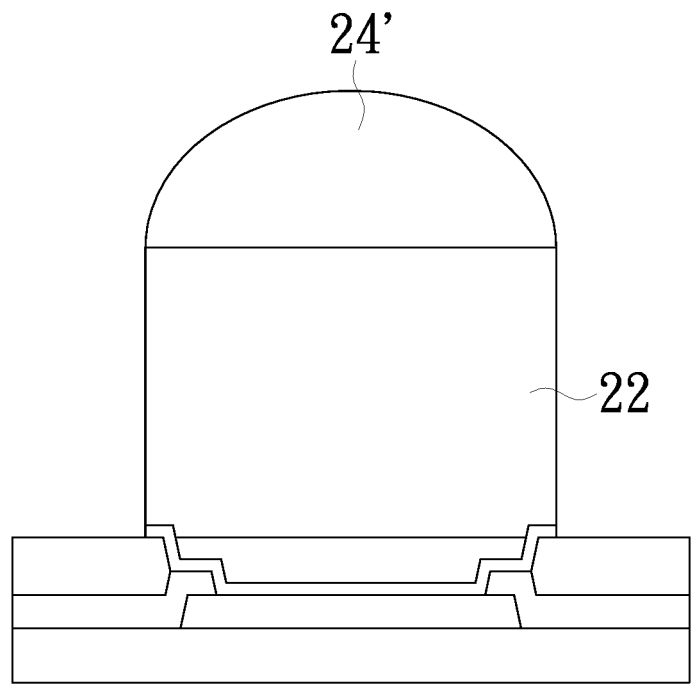

Continue with the above description, as shown in FIG. 7E and FIG. 7F, a second photoresist layer 42 having a second opening 421 is formed on the under bump metal layer 18B', and the second opening 421 is larger than the first opening 401 of the first photo-resist layer 40. By using the second photoresist layer 42 as a mask, a bump structure such as the copper pillar 22 is formed on the stress buffer layer 20B and a portion of the exposed under bump metal layer 18B', wherein the copper pillar 22 simultaneously covers the stress buffer layer 20B and a portion of the under bump metal layer 18B' around the stress buffer layer 20B. Next, as shown in FIGS. 7G to 7I, a solder structure 24' is formed by using the same second photoresist layer 42 as a mask. Next, the second photoresist layer 42 and a portion of the under bump metal layer 18B' not covered by the copper pillar 22 are removed, and then the solder structure 24' is reflowed to bond with the copper pillar 22 and the solder structure 24' is melted into a spherical or hemispherical shape.

The process flow shown in FIGS. 7B to 7I is substantially the same as the process flow shown in FIGS. 6E to 6L. The specific or detailed process is described in the description of FIGS. 6E to 6L, and details are not described herein again. Also, after the stress buffer layer 20B is formed, a barrier layer (not shown) may be electroplated on the stress buffer layer 20B by continuing to use the first photoresist layer 40 as a mask, and then the first photoresist layer 40 is removed.

Figure 8A:
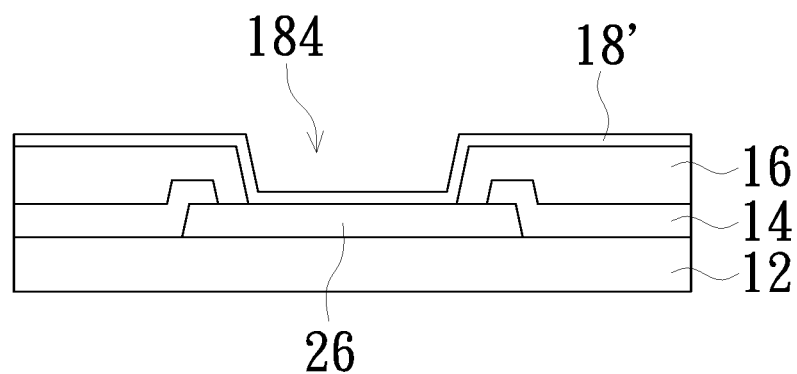
FIGS. 8A to 8G are schematic diagrams showing a process flow of a method for manufacturing a semiconductor apparatus according to another embodiment of the present invention.

In the foregoing method for manufacturing a semiconductor apparatus, the stress buffer layer 20/20B, the copper pillar 22, and the solder structure 24' are forming by using two photoresist layers, namely the first photoresist layer 40 and the second photoresist layer 42. But, it is not limited thereto, and the stress buffer layer 20/20B, the copper pillar 22, and the solder structure 24' may be formed by using single photoresist layer as a mask. FIGS. 8A to 8G are schematic diagrams showing a process flow of a method for manufacturing a semiconductor apparatus according to another embodiment of the present invention. FIG. 8A illustrates that a first passivation layer 14, a second passivation layer 16 and an under bump metal layer 18' have been formed on a semiconductor substrate 12 having a metal pad 26, and the method for forming the same has been shown in FIGS. 6A to 6D, and details are not described herein again. Wherein, the under bump metal layer 18' is slightly concave to have an accommodating portion 184 at a position corresponding to the metal pad 26.

Figure 8B:
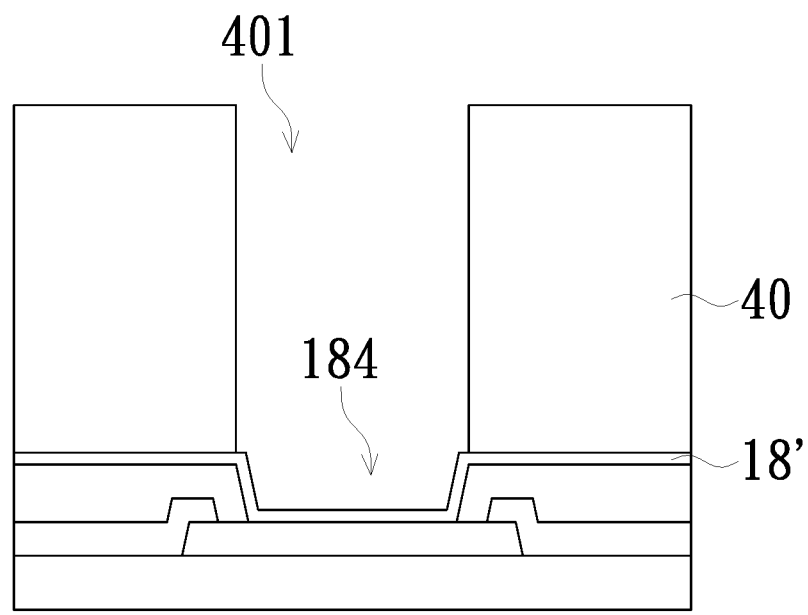
Figure 8C:
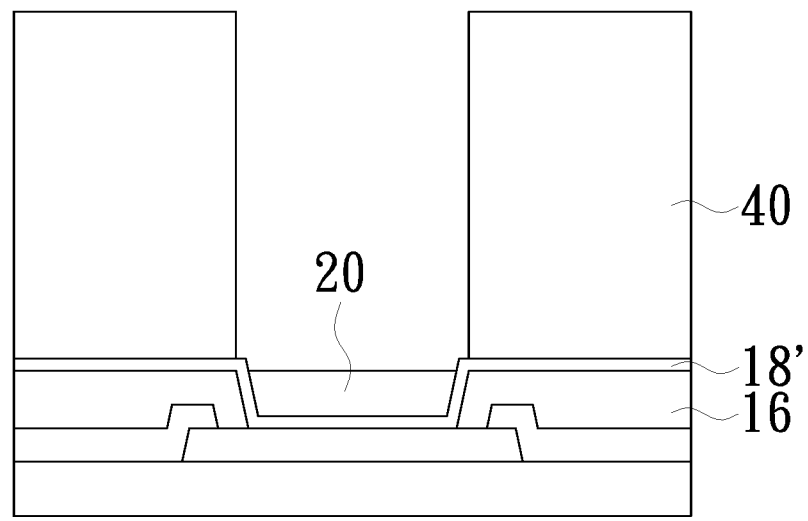

As shown in FIG. 8B, a first photoresist layer 40 is formed on the under bump metal layer 18', and a first opening 401 is formed in the first photoresist layer 40 by using exposure and development technique. In one embodiment, the position of the first opening 401 corresponds to the position of the accommodating portion 184, and the size of the first opening 401 may be equal to or slightly larger than the size of the accommodating portion 184, and a portion of the under bump metal layer 18' is exposed by the first opening 401, for example, the portion of the under bump metal layer 18' that is in contact with the metal pad 26 is exposed. Next, as shown in FIG. 8C, a stress buffer layer 20 is electroplated on the under bump metal layer 18' by using the first photoresist layer 40 as a mask. The material of the stress buffer layer 20 is selected from one of tin, tin silver, tin alloy, indium and indium alloy. In one embodiment, the height of the stress buffer layer 20 does not exceed the height of the accommodating portion 184 (labeled in FIG. 8B). For example, the surface of the stress buffer layer 20 is not higher than the surface of the second passivation layer 16.

Figure 8D:
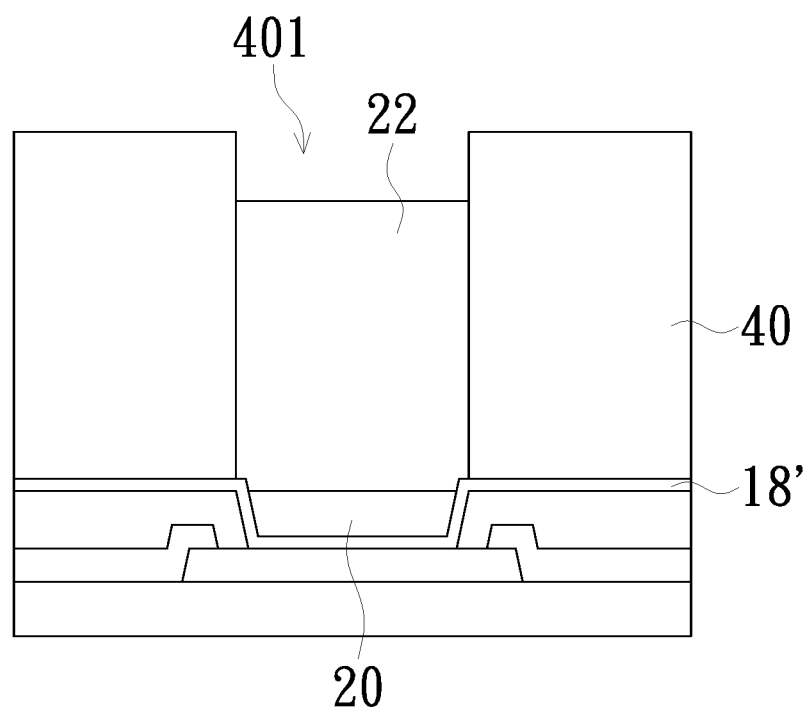
Figure 8E:
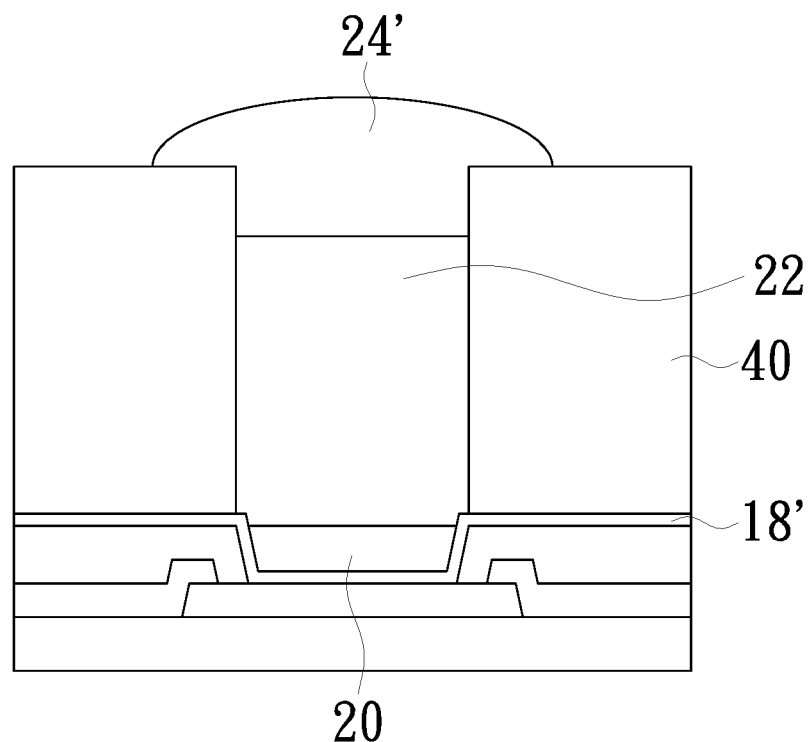

Next, as shown in FIG. 8D, a copper plating treatment is performed by continuing to use the first photoresist layer 40 as a mask, to make the precipitate of copper in the plating solution to be plated to the stress buffer layer 20 to form a bump structure such as the copper pillar 22, wherein the copper pillar 22 simultaneously covers the stress buffer layer 20 and a portion of the under bump metal layer 18' around the stress buffer layer 20, and the copper pillar 22 does not completely fill the first opening 401 of the first photoresist layer 40. Thereafter, as shown in FIG. 8E, a solder plating process is performed by using the same first photoresist layer 40 as a mask, to form a mushroom-like solder structure 24' on the surface of the copper pillar 22, wherein the solder structure 24' fills the first opening 401 (labeled in FIG. 8D) of the first photoresist layer 40 and protrudes over the first photoresist layer 40.

Figure 8F:
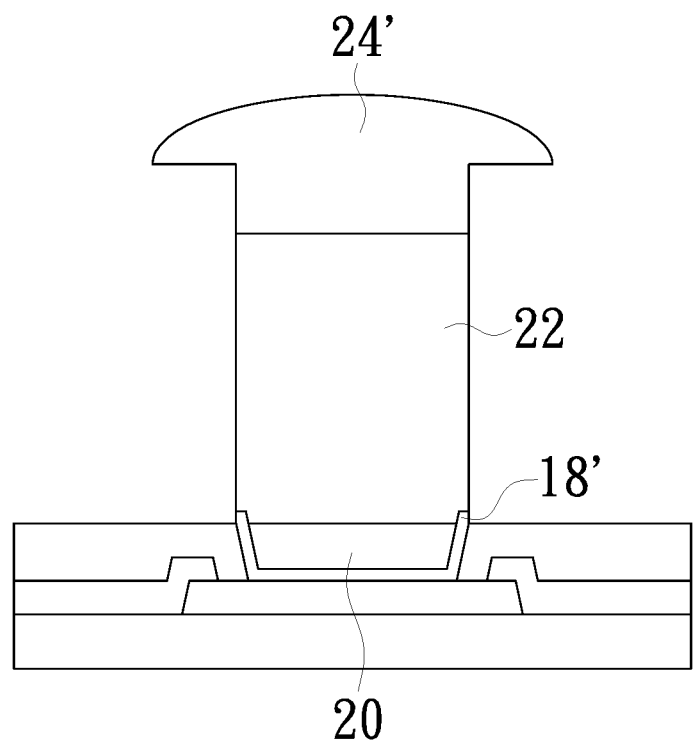
Figure 8G:
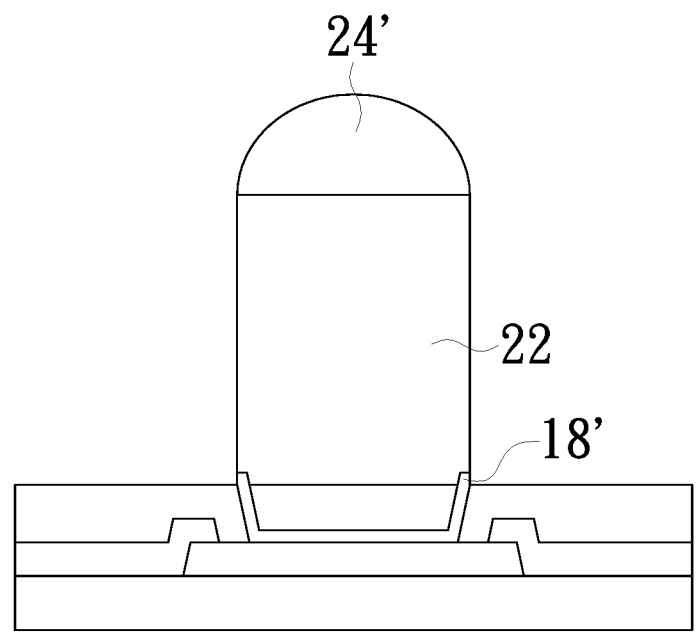

Next, as shown in FIG. 8F, the first photoresist layer 40 is removed, and a portion of the under bump metal layer 18' not covered by the copper pillar 22 is etched while or after the first photoresist layer 40 is removed. Finally, the solder structure 24' is reflowed, as shown in FIG. 8G, and the solder structure 24' is melted into a spherical shape or a hemispherical shape.

Wherein, in another embodiment not shown, a barrier layer may be electroplated on the stress buffer layer 20 by using the first photoresist layer 40 as a mask after the stress buffer layer 20 is formed and before the copper pillar 22 is formed, so that the barrier layer is arranged between the stress buffer layer 20 and the copper pillar 22.

In the embodiments of the semiconductor apparatus of the present invention, by arranging the stress buffer layer between the copper pillar and the under bump metal layer, the higher thermal-mechanical stress on the semiconductor apparatus, which is caused by higher Young's modules and high thermal expansion of the copper, can be effectively reduced to prevent from the IMD delamination, and the problem of cracks caused by the difference in thermal expansion coefficient between materials can also be improved during the reflow process and device operation. In addition, by arranging the barrier layer into the interface of the stress buffer layer and the copper pillar, the consumption of the stress buffer layer during the reflow process and device operation can be reduced to increase the lifetime of the semiconductor apparatus.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:
1. A semiconductor apparatus, comprising:
a semiconductor substrate having at least one metal pad;
a first passivation layer formed on the semiconductor substrate and covering a portion of the at least one metal pad, the first passivation layer having at least one first passivation layer opening to expose a first portion of the at least one metal pad;
a second passivation layer formed on the first passivation layer, the second passivation layer having at least one second passivation layer opening to expose a second portion of the at least one metal pad;
an under bump metal layer at least formed on the second portion of the at least one metal pad exposed by the second passivation layer opening;
a stress buffer layer formed on the under bump metal layer, wherein a top surface of the stress buffer layer is not higher than a top surface of the second passivation layer; and
a copper pillar disposed on the stress buffer layer.

2. The semiconductor apparatus according to claim 1, wherein the material of the stress buffer layer comprises tin, tin-silver, tin alloy, indium or indium alloy, and the material of the under bump metal layer comprises titanium, titanium-tungsten or copper.

3. The semiconductor apparatus according to claim 1, further comprising a solder structure disposed on the copper pillar.

4. The semiconductor apparatus according to claim 1, further comprising a barrier layer disposed between the copper pillar and the stress buffer layer.

5. The semiconductor apparatus according to claim 4, wherein the material of the barrier layer is nickel, titanium or tantalum.

6. The semiconductor apparatus according to claim 1, wherein a cross-sectional area of the copper pillar is greater than or equal to a cross-sectional area of the stress buffer layer.

7. The semiconductor apparatus according to claim 1, wherein an area of the first passivation layer opening is greater than an area of the second passivation layer opening, and a cross-sectional area of the copper pillar is greater than the area of the first passivation layer opening and the area of the second passivation layer opening.

8. The semiconductor apparatus according to claim 1, wherein an area of the first passivation layer opening is smaller than an area of the second passivation layer opening, and the under bump metal layer directly contacts a portion of the first passivation layer and a portion of the second passivation layer.

9. The semiconductor apparatus according to claim 1, wherein the under bump metal layer is further formed on an inner wall of the second passivation layer opening, and a portion of the second passivation layer at a periphery of the second passivation layer opening.

10. The semiconductor apparatus according to claim 9, wherein the copper pillar further covers the portion of the second passivation layer at the periphery of the second passivation layer opening.

11. A method for manufacturing a semiconductor apparatus, comprising:
providing a semiconductor substrate having at least one metal pad;
forming a first passivation layer on the semiconductor substrate and covering a portion of the at least one metal pad, the first passivation layer having at least one first passivation layer opening to expose a first portion of the at least one metal pad;
forming a second passivation layer on the first passivation layer, the second passivation layer having at least one second passivation layer opening to expose a second portion of the at least one metal pad;

forming an under bump metal layer on the exposed second portion of the at least one metal pad, an inner wall of the second passivation layer opening, and a portion of the second passivation layer;

forming a stress buffer layer on a portion of the under bump metal layer on the at least one metal pad, wherein a top surface of the stress buffer layer is not higher than a top surface of the second passivation layer;

forming a copper pillar on the stress buffer layer to cover the stress buffer layer and a portion of the under bump metal layer; and forming a solder structure on the copper pillar.

12. The method for manufacturing the semiconductor apparatus according to claim 11, wherein the material of the stress buffer layer comprises tin, tin-silver, tin alloy, indium or indium alloy.

13. The method for manufacturing the semiconductor apparatus according to claim 11, wherein a barrier layer is further formed on the stress buffer layer before forming the copper pillar, such that the barrier layer is located between the stress buffer layer and the copper pillar, and the material of the barrier layer is nickel, titanium or tantalum.

14. The method for manufacturing the semiconductor apparatus according to claim 11, wherein the formation of the stress buffer layer, the copper pillar and the solder structure comprises the following steps:

forming a first photoresist layer on the under bump metal layer and forming at least one first opening in the first photoresist layer to expose a portion of the under bump metal layer via the first opening;

electroplating the stress buffer layer on the portion of the under bump metal layer exposed by the first opening;

electroplating the copper pillar on the stress buffer layer exposed by the first opening;

electroplating the solder structure on the copper pillar; and removing the first photoresist layer.

15. The method for manufacturing the semiconductor apparatus according to claim 14, wherein the copper pillar further covers a portion of the under bump metal layer around the stress buffer layer.

16. The method for manufacturing the semiconductor apparatus according to claim 15, wherein a portion of the under bump metal layer that is not covered by the copper pillar is removed while or after the first photoresist layer is removed.

17. The method for manufacturing the semiconductor apparatus according to claim 11, wherein the formation of the stress buffer layer, the copper pillar and the solder structure comprises the following steps:

forming a first photoresist layer on the under bump metal layer and forming at least one first opening in the first photoresist layer to expose a portion of the under bump metal layer via the first opening;

electroplating the stress buffer layer on the portion of the under bump metal layer exposed by the first opening;

removing the first photoresist layer;

forming a second photoresist layer on the under bump metal layer and forming at least one second opening in the second photoresist layer, the second opening being larger than the first opening, to expose the stress buffer layer and a portion of the under bump metal layer via the second opening;

electroplating the copper pillar on the stress buffer layer and the portion of the under bump metal layer exposed by the second opening;

electroplating the solder structure on the copper pillar; and removing the second photoresist layer.

18. The method for manufacturing the semiconductor apparatus according to claim 17, wherein a portion of the under bump metal layer that is not covered by the copper pillar is removed while or after the second photoresist layer is removed.

* * * * *